United States Patent
Shen et al.

(10) Patent No.: US 7,919,358 B2
(45) Date of Patent: *Apr. 5, 2011

(54) METHOD FOR FABRICATING MULTI-CHIP STACKED PACKAGE

(75) Inventors: Geng-Shin Shen, Hsinchu (TW);
Yu-Ren Chen, Hsinchu (TW)

(73) Assignee: Chipmos Technologies Inc, Hsinchu (TW)

( * ) Notice: Subject to any disclaimer, the term of this patent is extended or adjusted under 35 U.S.C. 154(b) by 40 days.

This patent is subject to a terminal disclaimer.

(21) Appl. No.: 12/134,336

(22) Filed: Jun. 6, 2008

(65) Prior Publication Data

US 2009/0075426 A1 Mar. 19, 2009

(30) Foreign Application Priority Data

Sep. 14, 2007 (TW) .............................. 96134358 A

(51) Int. Cl.
*H01L 21/00* (2006.01)

(52) U.S. Cl. ........ 438/109; 257/686; 257/676; 257/777; 257/696; 257/723; 438/123

(58) Field of Classification Search ........................ None
See application file for complete search history.

(56) References Cited

U.S. PATENT DOCUMENTS

| | | | |
|---|---|---|---|
| 4,982,265 A | 1/1991 | Watanabe et al. | |
| 5,138,438 A | 8/1992 | Masayuki et al. | |
| 5,789,803 A * | 8/1998 | Kinsman | 257/666 |
| 6,744,121 B2 * | 6/2004 | Chang et al. | 257/668 |
| 6,838,754 B2 * | 1/2005 | Kim | 257/666 |
| 6,919,627 B2 * | 7/2005 | Liu et al. | 257/686 |
| 6,977,427 B2 * | 12/2005 | Hetzel et al. | 257/676 |
| 2005/0200009 A1 * | 9/2005 | Kang et al. | 257/734 |
| 2009/0072361 A1 * | 3/2009 | Shen et al. | 257/670 |

OTHER PUBLICATIONS

U.S. Appl. No. 12/122,779, filed May 19, 2008, Shen, et al.

* cited by examiner

*Primary Examiner* — David Vu
*Assistant Examiner* — Shantanu C Pathak
(74) *Attorney, Agent, or Firm* — Ming Chow; Sinorica, LLC

(57) ABSTRACT

A multi-chips stacked package method which includes providing a lead frame includes a top surface and a reverse surface formed by a plurality of inner leads and a plurality of outer leads; fixing a first chip on the reverse surface of the lead frame and the active surface of the first chip includes a plurality of first pads closed to the central region; forming a plurality of first metal wires, and the first pads are electrically connected to the first inner leads and the second inner leads by the first metal wires; forming a plurality of metal spacers on the thermal fin of the lead frame; fixing a second chip to electrically connect to the top surface of the first inner leads and the second inner leads; forming a plurality of second metal wires, and the second pads are electrically connected to the top surface of the first inner leads and the second inner leads; and flowing a molding to form an encapsulated material to cover the first chip, the first metal wires, the second chip, the second metal wires, the first inner leads and the second inner leads and the outer leads being exposed.

22 Claims, 5 Drawing Sheets

US 7,919,358 B2

METHOD FOR FABRICATING MULTI-CHIP STACKED PACKAGE

BACKGROUND OF THE INVENTION

1. Field of the Invention

The present invention is related to an integrated circuit package structure, more particularly, is related to an integrated circuit package structure implemented by lead on chip (LOC) and chip on lead (COL) technique.

2. Description of the Prior Art

In recent years, the back end process of the semiconductor package is 3-dimension (3D) package process in order to use less area with higher density or higher memory storage volume. In order to achieve this object, the multi-chips stacked are used in 3D package process.

In prior art, such as U.S. Pat. No. 6,744,121, it is a multi-chips stacked package structure with lead frame, as shown in FIG. 1a. Obviously, the lead frame in the package structure of FIG. 1a is bent several times to avoid the metal wires on the bottom chip are contacted to the bottom of the top chip. The metal wires of the bottom chip are protected in accordance with the formation of the height difference by bending the lead frame. However, the lead frame is bent several times and is easy to be deformed. The rest of the chips are hard to stack correctly. Besides, the bent lead frame is easy to loose the package structure so as the package structure can be reduced. Besides, because the lead frame is bent several times, the adhesive area between the chips and the lead frame is not enough and the chips are easy to be loosed during the molding process.

Besides, other multi-chips stacked package structure by using lead frame is disclosed in U.S. Pat. Nos. 6,838,754 and 6,977,427, as shown in FIG. 1b and FIG. 1c. During the connection between the top chip and the bottom chip, the bottom of the top chip is easy to contact to the metal wires of the bottom chip and cause the short circuit or the metal wires loosed in the embodiments shown in FIG. 1b and FIG. 1c.

Besides, multi-chips stacked in a package structure are easy to cause the heat effect when the multi-chips are operated. When the heat is hard to release from the multi-chips stacked package structure, the reliability of the chips are decreased.

SUMMARY OF THE INVENTION

According to the problems described above, the object of the present invention is to provide a package structure by using an insulation layer to isolate the top chip and the bottom chip to protect the metal wires of the bottom chip.

The other object of the present invention is to provide a package method of the multi-chips stacked package structure by using the lead frame as the substrate and let the metal spacer connect to the thermal fin of the lead frame. The heat generated by operating the multi-chips package structure is released out of the package structure according to the thermal fin of the lead frame and the reliability of the chip is enhanced.

According to above objects, the present invention provides a multi-chips stacked package method which comprising: providing a lead frame, and the lead frame includes a top surface and a reverse surface formed by a plurality of inner leads and a plurality of outer leads, and the inner leads includes a plurality of first paralleled inner leads and a plurality of second paralleled inner leads, and the ends of the first inner leads and the ends of the second inner leads are opposite to each other with an interval, the first inner leads and the second inner leads respectively includes a thermal fin closed to a central region thereof; fixing a first chip, the first chip is fixed on the reverse surface of the lead frame and the active surface of the first chip includes a plurality of first pads closed to the central region, the first pads are exposed in the interval between the first inner leads and the second inner leads; forming a plurality of first metal wires, and the first pads of the first chips are electrically connected to the first inner leads and the second inner leads by the first metal wires; forming a plurality of metal spacers, and at least one pair of the metal spacers are formed on the thermal fin of the lead frame; fixing a second chip, and the second pads on the active surface of the second chip are electrically connected to the top surface of the first inner leads and the second inner leads; forming a plurality of second metal wires, and the second pads on the active surface of the second chip are electrically connected to the top surface of the first inner leads and the second inner leads; and flowing a molding to form an encapsulated material to cover the first chip, the first metal wires, the second chip, the second metal wires, the first inner leads and the second inner leads and the outer leads being exposed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components.

Figure 1A:
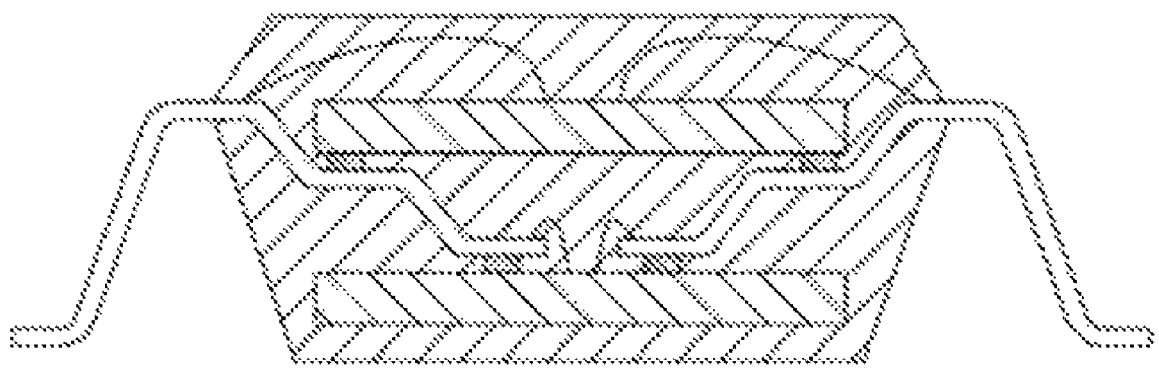
FIG. 1a is a sectional view of the multi-chips stacked package structure in prior art.
Figure 1B:
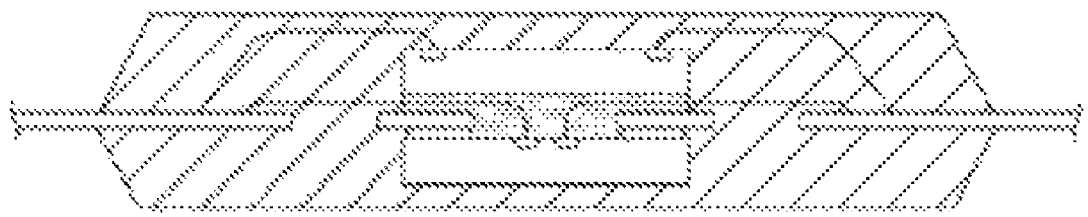
FIG. 1b is a sectional view of another multi-chips stacked package structure in prior art.
Figure 1C:
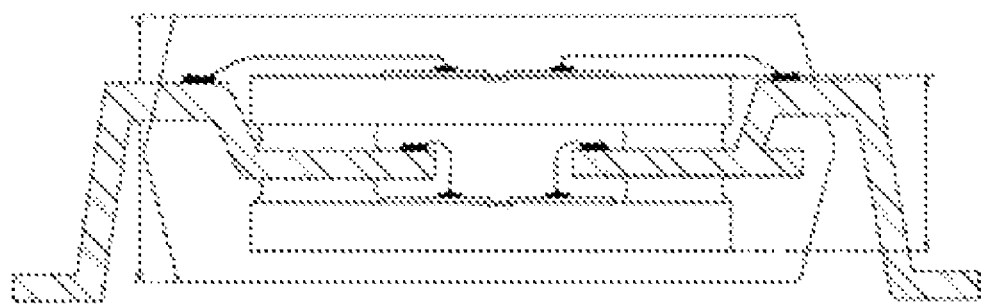
FIG. 1c is a sectional view of one another multi-chips stacked package structure in prior art.
Figure 2:
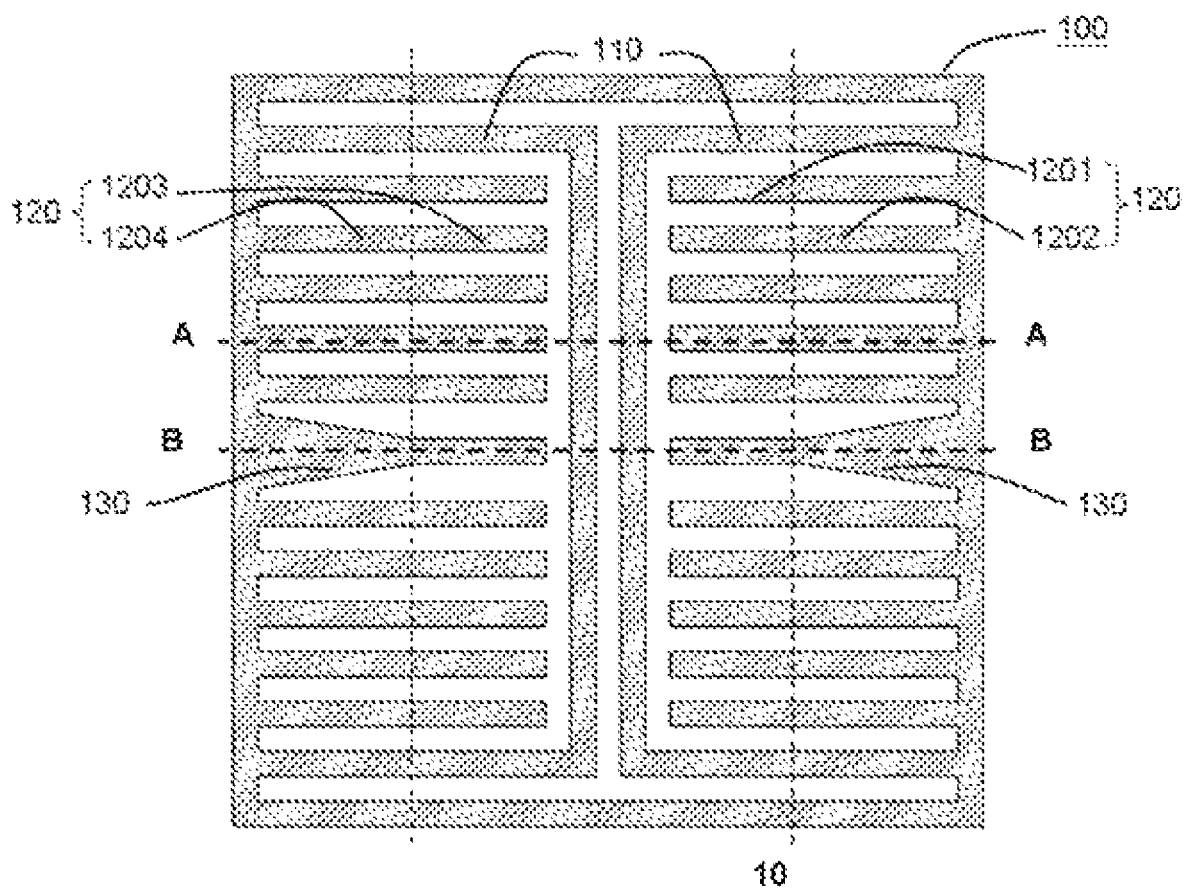
FIG. 2 is a top view of the multi-chips stacked package structure according to one embodiment of the present invention.

In the semiconductor package process, the wafer is doing a thinning process after the front end process to thin the size of the chip between 2~20 mils. A coating or printing process is used to coat or print a polymer on the bottom of the chip. The polymer is made by a resin or a B-Stage resin. A baking or photo-lighting process is used to let the polymer be a semi-glue material. Then a removable tape is used to stick on the polymer and the wafer sawing process is used to saw the wafer into several dies. Therefore, each of the dies is connected to the substrate and stacked to each other. FIG. 2 is a bottom view showing a lead frame structure according to the present invention. As shown in FIG. 2, the reference number 100 is the lead frame structure, the reference number 110 is a bus bar, the reference number 120 is a lead of the lead frame and the reference number 130 is a thermal fin of the lead frame. The following description and the corresponding drawings are according to the sectional view of the A and B line segment.

At first, as shown in FIG. 2, the lead frame 100 includes a top surface and a reverse surface and the leads 120 of the lead frame are composed by a plurality of inner leads and a plurality of outer leads. The line segment 10 is used to be the boarder line between the inner leads and the outer leads. The inner leads are composed by a plurality of first inner leads 1201 and a plurality of second inner leads 1203. The ends of the first inner leads 1201 and the ends of the second inner leads 1203 are relatively arranged by an interval.

The first inner leads 1201 and the second inner leads 1203 closed to the central region respectively include a thermal fin in the leads 120 of the lead frame 100. The width of the thermal fin 130 is wider than the inner leads thereof and the thermal fin 130 is able to form a fan-shape closed to the inner leads. Besides, the external of the first inner leads 1201 and the second inner leads 1203 further respectively include a bus bar 110 in the lead frame 100 of the present invention. The bus bar 110 can be the power connective point, the grounded point or the signal connective point.

Figure 3:
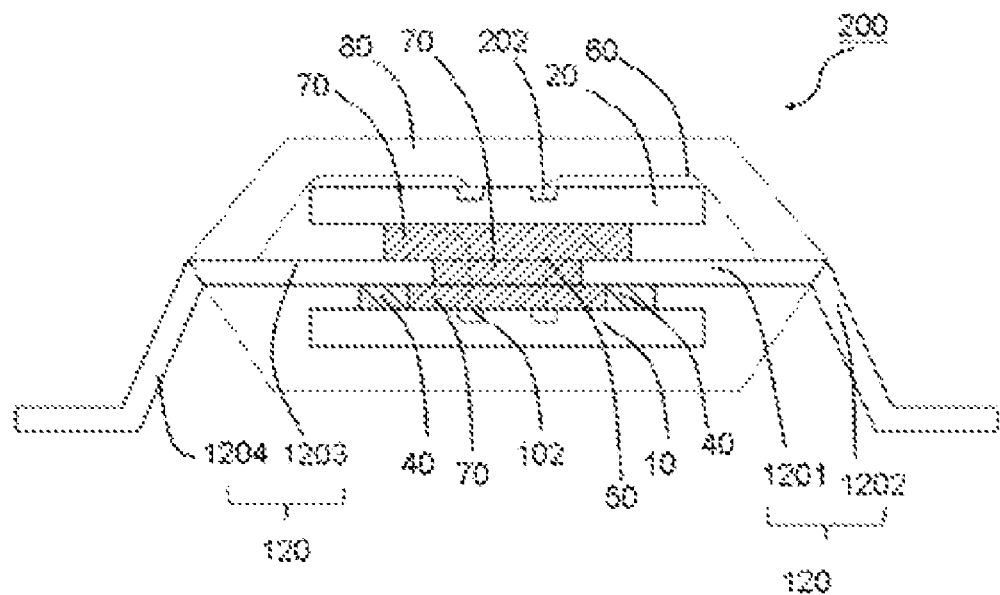
FIG. 3 is a view of the multi-chips stacked package structure according to one embodiment of the present invention.

Now, FIG. 3 is a sectional view showing the multi-chips stacked package structure in the AA line segment according to the present invention. The multi-chips package structure 200 in the AA segment of the lead frame 100 includes: the lead 120 of the lead frame 100, the first chip (also called the bottom chip) 10, the second chip (or called the top chip) 20, a plurality of first metal wires 50 and a plurality of second metal wires 60.

As shown in FIG. 3, at first, the first chip 10 is provided and a plurality of first pads 102 is disposed near the central region of the active surface of the first chip 10. And an adhesive layer 40 is formed on a portion of the active surface of the first chip 10 and the adhesive layer 40 is a tape or a die attached film, it is not limited herein. Therefore, the adhesive material with sticking ability is included in the present invention. In addition, the adhesive layer 40 is able to form on the reverse surface of the lead frame 100 first and it is also not limited herein. And then, the first chip 10 is stuck on the reverse surface of the lead frame 100 to form a lead on chip (LOC) structure. The first pads 102 of the first chip 10 are exposed at the interval between the first inner leads 1201 and the second inner leads 1203. Therefore, a wire bonding process is executed to electrically connect the first metal wires 50 on the first inner leads 1201 and the second inner leads 1203. During the wire bonding process, the wire bonding machine (not shown) will form a metal spacer 30 on the thermal fin 130 of the lead frame 100. The height of the metal spacer 30 is higher than the curved height of the first metal wire 50. The metal spacer 30 is made by stacking a plurality of solder balls or metal bumps.

There is a sticky polymer material 70 coating near the interval between the ends of the first inner leads 1201 and the second leads. The polymer material 70 covers the first pads 102 of the first chip 10 and the first metal wires 50. Then, a second chip 20 is provided and the bottom portion of the second chip 20 is stuck on the polymer material 70 to fix the second chip 20 on the top surface of the lead frame 70 to form a Chip on Lead (COL) structure. The polymer material 70 is a resin, such as a B-stage resin.

Figure 4:
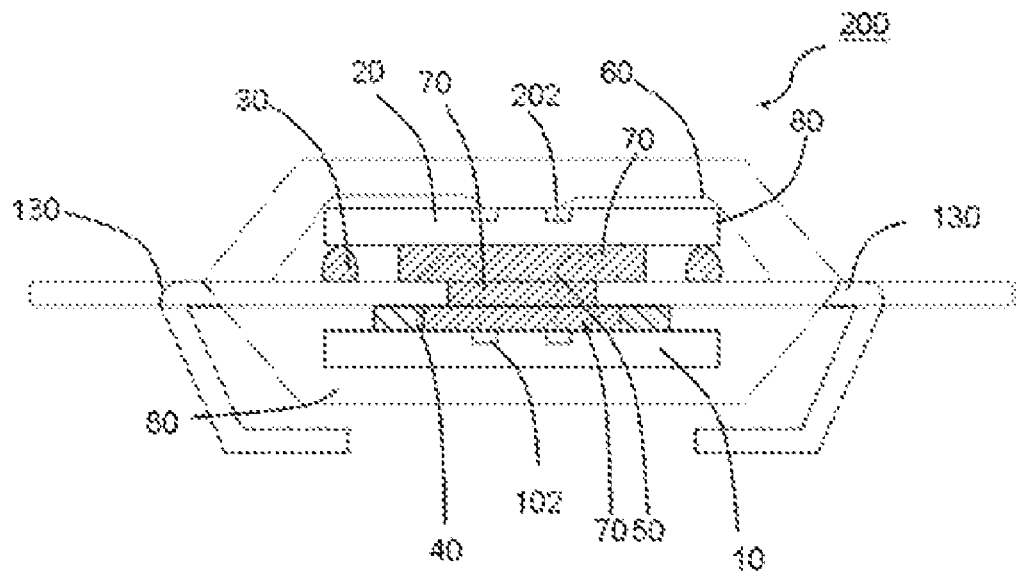
FIG. 4 is a view of the multi-chips stacked package structure according to another embodiment of the present invention.

Now, there is a metal spacer 30 formed on the top surface of the thermal fin 130 of the lead frame 100, as shown in FIG. 4 (FIG. 4 is a sectional view showing the multi-chips stacked structure of the present invention in the BB line segment).

Therefore, when the bottom of the second chip 20 is stuck on the polymer material 70, the bottom of the second chip 20 is contacted to the metal spacer 30. Because the height of the metal spacer 30 is higher than the curved height of the first metal wire 50, the metal spacer 30 isolates the first metal wires of the first chip 10 and the bottom of the second chip 20 when the bottom of the second chip 20 is contacted to the metal spacer 30.

After connecting the second chip 20 on the top surface of the lead frame 100, there is an optional baking process used to solidify the polymer material 70.

Then, a second wire bonding is used to electrically connect the second pads 202 of the second chip 20 on the first inner leads 1201 and the second inner leads 1203 by the reverse wire bonding of the second metal wires 60. An encapsulated material 80 made by a molding process covers the first chip 10, the second chip 20 and the inner leads 1201 (1203) of the lead frame 100 and expose the outer leads 1202 (1204) out of the encapsulated material 80. At final, a sawing or stamping process is used to bend the outer leads 1202 (1204) of the lead frame 100, as shown in FIG. 3. Besides, it should be noted that the method of bending the thermal fin 130 the lead frame 100 of the present invention is same as the method used in outer leads 1202 (1204) or bending forward to the two sides of the encapsulated material 80, as shown the dot lines in FIG. 4. Therefore, when the package structure of the present invention is electrically connected to a circuit board (not shown), the bottom of the thermal fin 130 bent by the two methods is contacted to the circuit board to be the suitable wire layout of the circuit board. Of course, it is obviously that the thermal fin 130 is bent upward (not shown) and hung in the air to release the heat included in one of the embodiment of the present invention.

Figure 5:
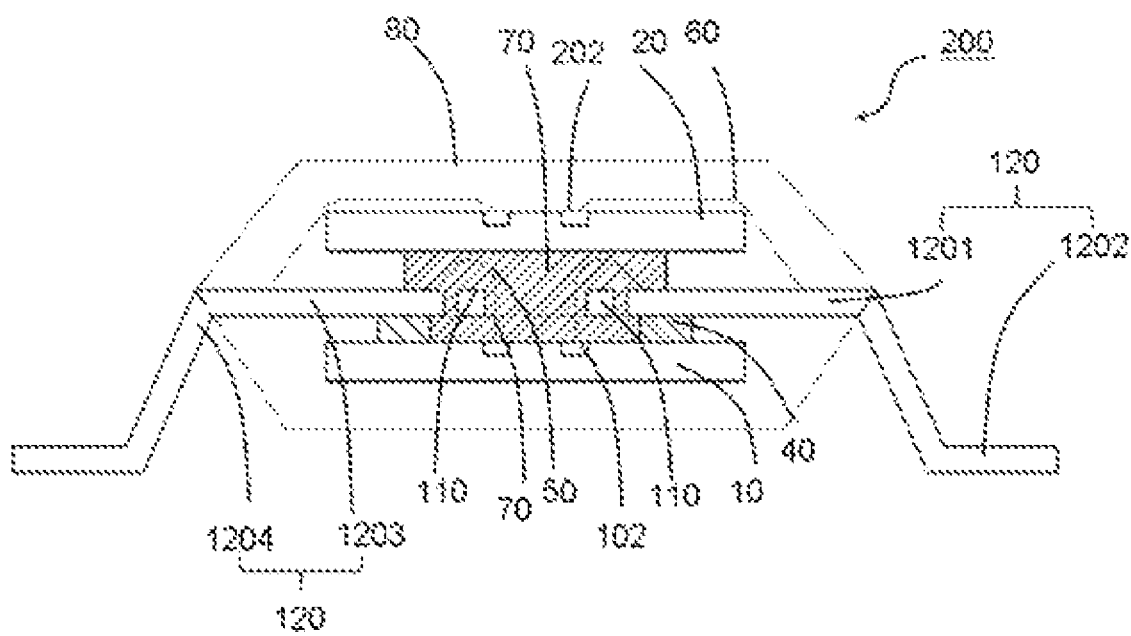
FIG. 5 is a view of the multi-chips stacked package structure with a bus bar according to one embodiment of the present invention.

Besides, FIG. 5 is a section view showing another embodiment of the multi-chips stacked package structure in the BB line segment of the lead frame 100. It is obviously that the different between FIG. 5 and FIG. 3 is the lead frame 100 in FIG. 5 with bus bar 100 structure. The bus bar 110 is used to be a power connective point, a grounded point or a signal connective point. Because the process of the stacked package structure in FIG. 5 is similar to the structure in FIG. 3, the description of the package process is omitted.

Figure 6:
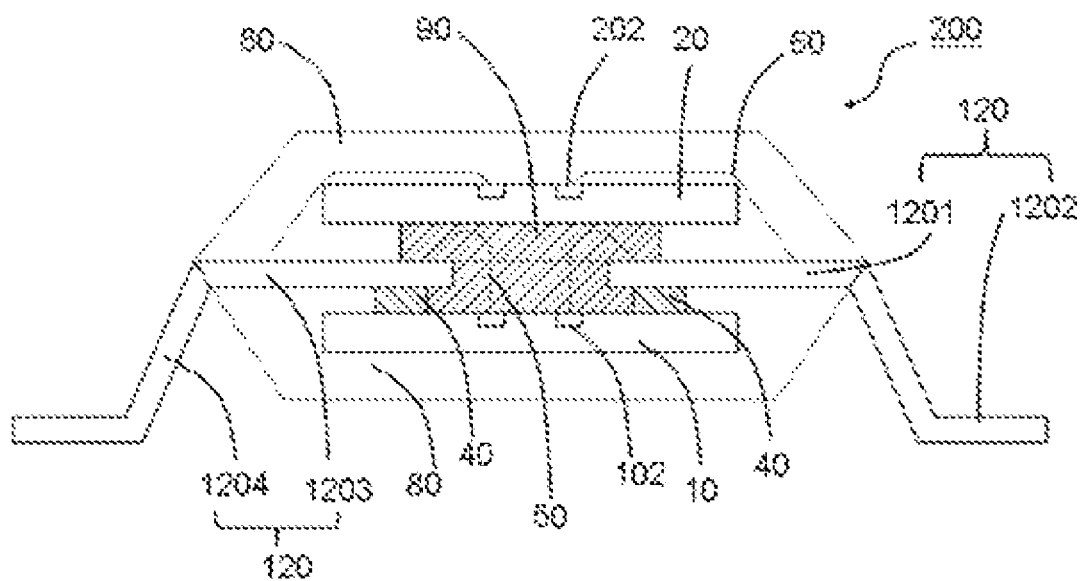
FIG. 6 is a view of the multi-chips stacked package structure according to one another embodiment of the present invention.
Figure 7:
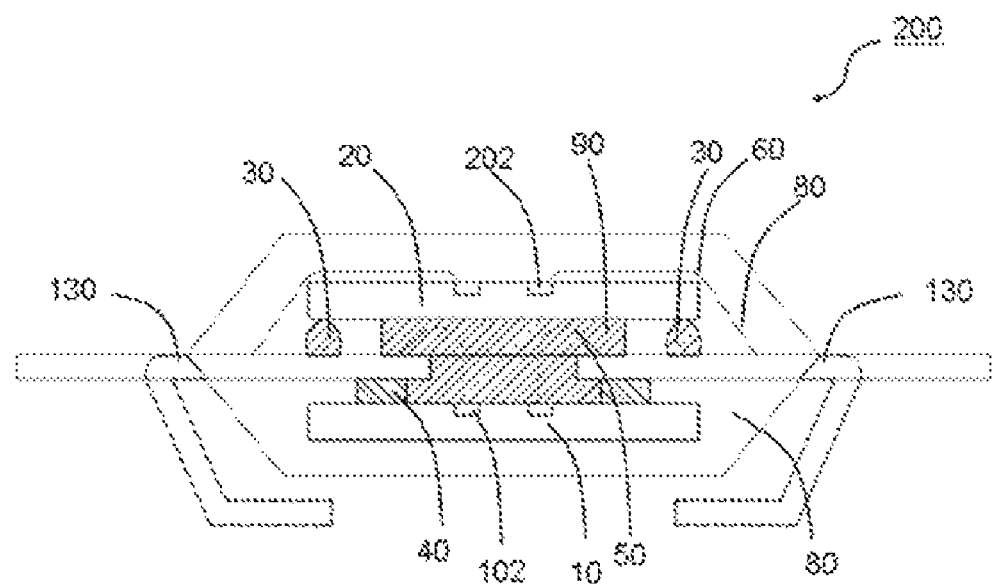
FIG. 7 is a view of the multi-chips stacked package structure according to one another embodiment of the present invention.

Now, FIG. 6 and FIG. 7 are another embodiment of the multi-chips stacked package structure in the present invention. As shown in FIG. 6, the lead frame 100 of this embodiment is similar to the structure shown in FIG. 2, the description is not repeated.

As shown in FIG. 6, the first chip is provided and a plurality of first pads 102 is disposed near the active surface of the first chip 10. An adhesive layer 40 is formed on a portion of the active surface of the first chip 10. The adhesive layer 40 is a tape or a die attached film. The adhesive layer 40 is formed on the bottom of the lead frame 100 first; it is not limited in the present invention. The first chip 10 is stuck on the bottom of the lead frame 100 to form a lead on chip (LOC) structure. The first pads 102 of the first chip 10 are exposed at the interval between the ends of the first inner leads 1201 and the second inner leads 1203. And then, a wire bonding process is used to electrically connect the first pads 102 on the first inner leads 1201 and the second inner leads 1203 by the first wires 50. During the wire bonding process, the wire bonding machine (not shown) will form a metal spacer 30 on the thermal fin 130 of the lead frame 100. The height of the metal spacer 30 is higher than the curved height of the first metal wires 50. The metal spacer 30 is made by stacking a plurality of solder balls or metal bumps.

A sticky polymer material 70 is coating near the interval between the ends of the first inner leads 1201 and the second inner leads 1203. The polymer material 70 is covering the first pads 102 of the first chip 10 and the first metal wires 50.

And then, a second chip 20 is provided and an adhesive layer 90 is formed on the bottom of the second chip 20. The adhesive layer 90 is stuck on the bottom of the second chip 20 or the adhesive layer 90 is stuck near two sides of the second chip 20. Besides, the adhesive layer 90 is a polymer material, such as a resin or a B-Stage resin. Besides, the adhesive layer 90 can be a glue film, too. The second chip 20 is fixed on the top surface of the inner leads 1201 (1203) of the lead frame 100 by the adhesive layer 90. The adhesive layer 90 of the bottom of the second chip 20 cover the first metal wire 50.

Because of the wire bonding process described above, an metal spacer 30 is formed on the top surface of the thermal fin 130 of the lead frame 100, as shown in FIG. 7 (FIG. 7 is a sectional view showing the multi-chips stacked structure of the present invention in the BB line segment). Therefore, the bottom of the second chip 20 is contacted to the metal spacer 30 when the bottom of the second chip 20 is stuck on the polymer material 70. Because the height of the metal spacer 30 is higher than the curved height of the first metal wires 50, the metal spacer 30 isolates the first metal wires 50 of the first chip 10 and the bottom of the second chip 20.

Then, a second wire bonding is used to electrically connect the second pads 202 of the second chip 20 on the first inner leads 1201 and the second inner leads 1203 by the reverse wire bonding of the second metal wires 60. An encapsulated material 80 made by a molding process covers the first chip 10, the second chip 20 and the inner leads 1201 (1203) of the lead frame 100 and expose the outer leads 1202 (1204) out of the encapsulated material 80. At final, a sawing or stamping process is used to bend the outer leads 1202 (1204) of the lead frame 100, as shown in FIG. 6. Besides, it should be noted that the method of bending the thermal fin 130 the lead frame 100 of the present invention is the same as the method used in outer leads 1202 (1204) or bending forward to the two sides of the encapsulated material 80, as shown the dot lines in FIG. 7.

When the thermal fin 130 is bent by the two method described above, the bottom of the thermal fin 130 and the outer leads 1202 (1204) are at the same horizontal surface. Therefore, when the package structure of the present invention is electrically connected to a circuit board (not shown), the bottom of the thermal fin 130 bent by the two methods is contacted to the circuit board to be the suitable wire layout of the circuit board. The heat effect of the package structure is passing from the metal spacer 30 to the thermal fin 130 and the heat is passing from the wider thermal fin 130 to the circuit board. Therefore, the heat is efficiently passing out of the package structure. Of course, it is obviously that the thermal fin 130 is bent upward (not shown) and hung in the air to release the heat included in one of the embodiment of the present invention.

Figure 8:
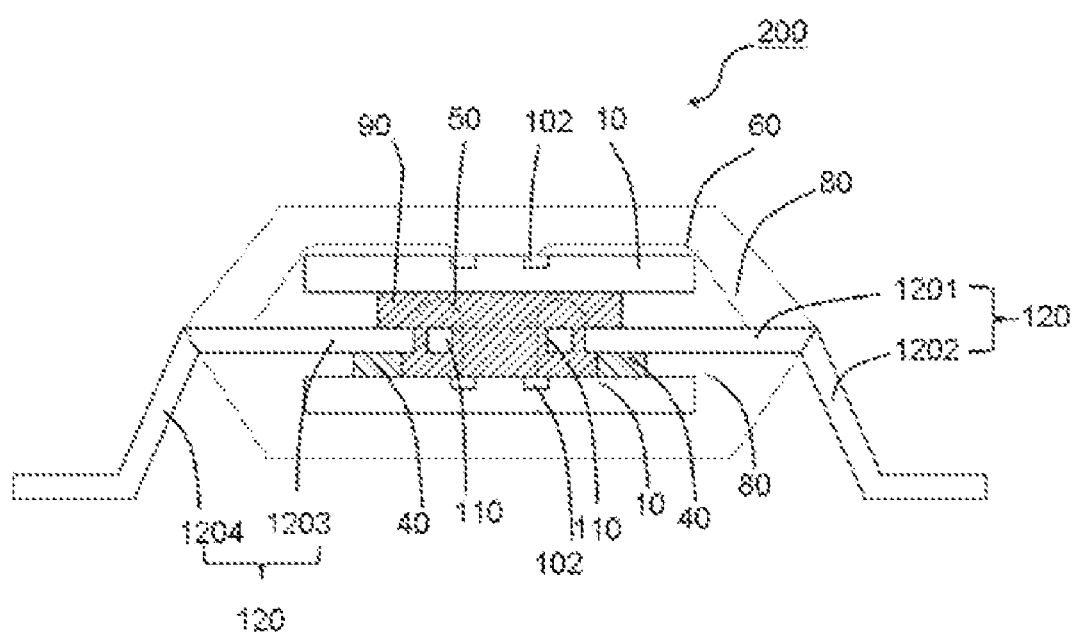
FIG. 8 is a view of the multi-chips stacked package structure with a bus bar according to one embodiment of the present invention.

Besides, FIG. 8 is a section view showing another embodiment of the multi-chips stacked package structure in the BB line segment of the lead frame 100. It is obviously that the different between FIG. 8 and FIG. 6 is the lead frame 100 in FIG. 8 including a bus bar 100 structure. The bus bar 110 is used to be a power connective point, a grounded point or a signal connective point. Because the process of the stacked package structure in FIG. 8 is similar to the structure in FIG. 6, the description of the package process is omitted.

According to the description above, the multi-chips stacked package structure disclosed in the present invention is used to solve the problem that the lead frame was bent too many times in the prior art. In the embodiments of the present invention, the lead frame can be used in multi-chips stacking without several times' bending. Because the connective element between the chips and the lead frame is sued to shorten the size of the multi-chips stacked package structure, the problem that the connection of the metal wires is shorted or released is avoided.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A multi-chips stacked package method comprising:
   providing a lead frame, and the lead frame includes a top surface and a reverse surface formed by a plurality of inner leads and a plurality of outer leads, and the plurality of inner leads includes a plurality of first paralleled inner leads and a plurality of second paralleled inner leads, and the ends of the plurality of first paralleled inner leads and the ends of the plurality of second paralleled inner leads are opposite to each other with an interval, the plurality of first paralleled inner leads and the plurality of second paralleled inner leads respectively includes a thermal fin closed to a central region thereof, wherein the width of the thermal fin is wider than the plurality of first paralleled inner leads and the plurality of second paralleled inner leads and the thermal fin is able to form a fan-shape closed to the plurality of first paralleled inner leads and the plurality of second paralleled inner leads respectively;
   providing a first chip, and the first chip includes an active surface, and a plurality of first pads are disposed near the central region of the active surface and exposed at the interval between the plurality of first paralleled inner leads and the plurality of second paralleled inner leads;
   fixing the first chip, the first chip is fixed on the reverse surface of the lead frame and the active surface of the first chip includes a plurality of first pads closed to the central region, the first pads are exposed in the interval between the first inner leads and the second inner leads;
   forming a plurality of first metal wires, and the first pads of the first chips are electrically connected to the plurality of first paralleled inner leads and the plurality of second paralleled inner leads by the first metal wires;
   forming a plurality of metal spacers, and at least one pair of the metal spacers are formed on the thermal fin of the lead frame during forming said plurality of first metal wires;

fixing a second chip, and the second pads on the active surface of the second chip are electrically connected to the top surface of the plurality of first paralleled inner leads and the plurality of second paralleled inner leads;

forming a plurality of second metal wires, and the second pads on the active surface of the second chip are electrically connected to the top surface of the plurality of first paralleled inner leads and the plurality of second paralleled inner leads; and flowing a molding to form an encapsulated material to cover the first chip, the first metal wires, the second chip, the second metal wires, the plurality of first paralleled inner leads and the plurality of second paralleled inner leads and the outer leads being exposed.

2. The package method according to claim 1 further includes disposing at least one bus bar at the interval between the ends of the plurality of first paralleled inner leads and the ends of the plurality of second paralleled inner leads.

3. The package method according to claim 1, wherein the height of the metal spacer is larger than the height of the curve of the first metal wires.

4. The package method according to claim 1, wherein the step to form the plurality of second metal wires is used by reverse wire bonding method.

5. The package method according to claim 1, wherein the thermal fin is bent toward the package structure.

6. The package method according to claim 5, wherein the thermal fin and the outer leads are in the same horizontal surface.

7. The package method according to claim 1, wherein the thermal fin is hung in the air.

8. A multi-chips stacked package method comprising:

providing a lead frame and the lead frame includes a top surface and a reverse surface formed by a plurality of inner leads and a plurality of outer leads, and the plurality of inner leads includes a plurality of first paralleled inner leads and a plurality of second paralleled inner leads, and the ends of the plurality of first paralleled inner leads and the ends of the plurality of second paralleled inner leads are opposite to each other with an interval, the plurality of first paralleled inner leads and the plurality of seconds paralleled inner leads respectively includes a thermal fin closed the central region, wherein the width of the thermal fin is wider than the plurality of first paralleled inner leads and the plurality of second paralleled inner leads and the thermal fin is able to form a fan-shape closed to the plurality of first paralleled inner leads and the plurality of second paralleled inner leads respectively;

providing a first chip, and the first chip includes an active surface, and a plurality of first pads are disposed near the central region of the active surface and exposed at the interval between the plurality of first paralleled inner leads and the plurality of second paralleled inner leads;

fixing the first chip, the first chip is fixed on the reverse surface of the lead frame and the active surface of the first chip includes a plurality of first pads closed to the central region, the plurality of first pads are exposed in the interval between the plurality of first paralleled inner leads and the plurality of second paralleled inner leads;

forming a plurality of first metal wires, and the plurality of first pads of the first chips are electrically connected to the plurality of first paralleled inner leads and the plurality of second paralleled inner leads by the plurality of first metal wires;

forming a first adhesive layer on a portion of the active surface of the first chip and on the reverse surface of the lead frame, and the first adhesive layer used to connect to the first chip, and a plurality of first pads disposed near the central region of active surface of the first chip are exposed in the interval between the plurality of first paralleled inner leads and the plurality of second paralleled inner leads by fixing the first adhesive layer on the reverse surface of the lead frame;

forming at least one metal spacer and at least one pair of the metal spacers on a thermal fin of the lead frame during forming said plurality of first metal wires;

forming a second adhesive layer on a portion of the active surface of the first chip and the second adhesive layer is coving the interval between the plurality of first metal wires and the ends of the plurality of first paralleled inner leads and the plurality of second paralleled inner leads;

fixing a second chip and a reverse surface of the second chip is fixed on the top surface of the lead frame by the second adhesive layer and the reverse surface of the second chip is contacted with the metal spacer and the active surface opposite to the reverse surface of the second chip includes a plurality of second pads disposed near the central region;

forming a plurality of second metal wires and the second pads on the active surface of the second chip is electrically connected to the top surface of the plurality of first paralleled inner leads and the plurality of second paralleled inner leads; and flowing a molding to form an encapsulated material to cover the first chip, the plurality of first metal wires, the second chip, the plurality of second metal wires, the plurality of first paralleled inner leads and the plurality of second paralleled inner leads and expose the plurality of outer leads.

9. The package method according to claim 8, wherein the first adhesive layer is formed on a portion of the active surface of the first chip.

10. The package method according to claim 8, wherein the first adhesive layer is a tape or a die attached film.

11. The package method according to claim 8, wherein the second adhesive layer is a polymer or B-Stage resin.

12. The package method according to claim 8, wherein the thermal fin is disposed in the edge of the outer leads of the lead frame.

13. The package method according to claim 8, wherein the height of the metal spacer is larger than the curved height of the first metal wires.

14. The package method according to claim 8, wherein the metal spacer is solder ball.

15. The package method according to claim 8, wherein the metal spacer is metal bump.

16. The package method according to claim 8, wherein the metal spacer is made by stacking the metal spacer.

17. The package method according to claim 8, wherein the step to form the plurality of second metal wires is used by a reverse wire bonding method.

18. The package method according to claim 8, wherein the thermal fin is bent in a direction toward the package structure.

19. The package method according to claim 8, wherein the thermal fin and the outer leads are in the same horizontal surface.

20. The package method according to claim 8, wherein the thermal fin is bent upward and hung in the air.

21. The package method according to claim 8 further comprising disposing at least one bus bar at an interval between the ends of the plurality of first paralleled inner leads and the plurality of second paralleled inner leads.

22. A multi-chips stacked package method comprising:

providing a lead frame and the lead frame includes a top surface and a reverse surface formed by a plurality of inner leads and a plurality of outer leads, and the plurality of inner leads include a plurality of first paralleled inner leads and a plurality of second paralleled inner leads, and the ends of the plurality of first paralleled inner leads and the ends of the plurality of second paralleled inner leads are opposite to each other with an interval, the plurality of first paralleled inner leads and the plurality of seconds paralleled inner leads respectively includes a thermal fin closed the central region thereof, wherein the width of the thermal fin is wider than the plurality of first paralleled inner leads and the plurality of second paralleled inner leads and the thermal fin is able to form a fan-shape closed to the plurality of first paralleled inner leads and the plurality of second paralleled inner leads respectively;

providing a first chip, and the first chip includes an active surface, and a plurality of first pads are disposed near the central region of the active surface and exposed at the interval between the plurality of first paralleled inner leads and the plurality of second paralleled inner leads;

fixing a first chip on the reverse surface of the lead frame, and the active surface of the first chip includes a plurality of first pads closed to the central region, the plurality of first pads are exposed in the interval between the plurality of first inner paralleled leads and the plurality of second paralleled inner leads;

forming a plurality of first metal wires, and the plurality of first pads of the first chips are electrically connected to the plurality of first inner paralleled leads and the plurality of second inner paralleled leads by the plurality of first metal wires;

forming a pair of metal spacers on the thermal fin of the lead frame during forming said plurality of first metal wires;

forming a first adhesive layer used to connect to the first chip, and a plurality of first pads disposed near the central region of active surface of the first chip are exposed in the interval between the plurality of first inner paralleled leads and the plurality of second inner paralleled leads by fixing the first adhesive layer in the reverse surface of the lead frame;

providing a second chip, and the second includes an active surface and a reverse surface opposite to the active surface, and a plurality of second pads are disposed near the central region of the active surface;

forming a second adhesive layer on a portion of the reverse surface of the second chip;

fixing the second chip on the top surface of the lead frame by the second adhesive layer, and the second adhesive layer covers the inner paralleled leads and the plurality of first metal wires on the plurality of second inner paralleled leads, and the reverse surface;

forming a plurality of second metal wires, and the plurality of second pads on the active surface of the second chip is electrically connected to the top surface of the plurality of first inner paralleled leads and the plurality of second inner paralleled leads; and flowing a molding to form an encapsulated material to cover the first chip, the plurality of first metal wires, the second chip, the plurality of second metal wires, the plurality of first inner paralleled leads and the plurality of second inner paralleled leads and expose the plurality of outer leads.

* * * * *